United States Patent
Kelly et al.

(10) Patent No.: US 7,459,065 B2
(45) Date of Patent: Dec. 2, 2008

(54) HYDROGEN GENERATOR PHOTOVOLTAIC ELECTROLYSIS REACTOR SYSTEM

(75) Inventors: Nelson A Kelly, Sterling Heights, MI (US); Thomas L Gibson, Utica, MI (US)

(73) Assignee: General Motors Corporation, Detroit, MI (US)

( * ) Notice: Subject to any disclaimer, the term of this patent is extended or adjusted under 35 U.S.C. 154(b) by 721 days.

(21) Appl. No.: 11/046,572

(22) Filed: Jan. 28, 2005

(65) Prior Publication Data

US 2005/0178427 A1      Aug. 18, 2005

Related U.S. Application Data

(60) Provisional application No. 60/545,374, filed on Feb. 18, 2004.

(51) Int. Cl.
| | | |
|---|---|---|
| C25B 1/04 | (2006.01) | |
| C25B 1/06 | (2006.01) | |
| C25B 9/06 | (2006.01) | |
| H01L 31/052 | (2006.01) | |
| H02N 6/00 | (2006.01) | |

(52) U.S. Cl. .................. 204/248; 204/278; 205/340; 205/628; 136/246

(58) Field of Classification Search ............ None
See application file for complete search history.

(56) References Cited

U.S. PATENT DOCUMENTS

| | | | | |
|---|---|---|---|---|
| 3,925,212 A | * | 12/1975 | Tchernev | 422/186 |
| 4,011,149 A | | 3/1977 | Nozik | 204/129 |
| 4,021,323 A | | 5/1977 | Kilby et al. | 204/129 |
| 4,052,228 A | * | 10/1977 | Russell | 136/246 |
| 4,246,080 A | * | 1/1981 | Shinn | 205/628 |
| 4,341,204 A | | 7/1982 | Bloxsom | |
| 4,341,607 A | * | 7/1982 | Tison | 205/343 |
| 4,352,772 A | * | 10/1982 | Bezner | 264/229 |
| 4,466,869 A | | 8/1984 | Ayers | 204/157.1 R |
| 4,528,252 A | | 7/1985 | Yamazaki | 429/111 |
| 4,778,579 A | | 10/1988 | Levy et al. | |
| 5,512,787 A | * | 4/1996 | Dederick | 290/4 R |

(Continued)

FOREIGN PATENT DOCUMENTS

JP      61096094      5/1986

(Continued)

OTHER PUBLICATIONS

HOGEN® RE Hydrogen Generators, Enabling Zero Emissions Hydrogen Supply, Proton Energy Systems® Transforming Energy™, 3 pgs, http://www.protonenergy.com/index.php/html/energysystems/home/index.html, Jun. 2, 2004.

(Continued)

*Primary Examiner*—Harry D Wilkins, III

(57) ABSTRACT

An apparatus for creating hydrogen from the disassociation of water using sunlight (photoelectrolysis) is provided. The system utilizes an aqueous fluid filled container which functions both to hold the water to be disassociated and as a light collecting lens. A photovoltaic module is positioned at a point to most efficiently accept the refracted light from the fluid filled container. A pair of electrodes which are coupled to the photovoltaic module are disposed within the fluid and configured to split the water into hydrogen and oxygen.

36 Claims, 5 Drawing Sheets

U.S. PATENT DOCUMENTS

| | | |
|---|---|---|
| 5,879,828 A | 3/1999 | Debe et al. |
| 6,136,412 A | 10/2000 | Spiewak et al. |
| 6,198,037 B1 | 3/2001 | Nakata ........................ 136/246 |
| 6,204,545 B1 * | 3/2001 | Nakata ........................ 257/459 |
| 6,319,293 B1 | 11/2001 | Debe et al. |
| 6,410,180 B1 | 6/2002 | Cisar et al. |
| 6,423,203 B1 | 7/2002 | Faita et al. |
| 6,519,951 B2 | 2/2003 | Ovshinsky et al. |
| 6,569,298 B2 | 5/2003 | Merida-Donis |
| 6,610,193 B2 | 8/2003 | Schmitman |
| 6,619,283 B2 | 9/2003 | Ghela |
| 6,666,961 B1 | 12/2003 | Skoczylas et al. |
| 2005/0183962 A1 * | 8/2005 | Oakes ........................ 205/340 |

FOREIGN PATENT DOCUMENTS

| | | |
|---|---|---|
| JP | 04013880 | 1/1992 |
| WO | WO2005/006391 | 1/2005 |
| WO | WO2005/036570 | 4/2005 |

OTHER PUBLICATIONS

Fahrenbruch et al., "Fundamentals of Solar Cells", Academic Press, New York, 1983, pp. 505-511.

* cited by examiner

US 7,459,065 B2

HYDROGEN GENERATOR PHOTOVOLTAIC ELECTROLYSIS REACTOR SYSTEM

CROSS-REFERENCE TO RELATED APPLICATIONS

This application claims the benefit of U.S. Provisional Application No. 60/545,374, filed on Feb. 18, 2004. The disclosure of the above application is incorporated herein by reference.

FIELD OF THE INVENTION

This invention relates to apparatus for electrolysis of water, and, more particularly, to photoelectrochemical (PEC) devices for the solar photoelectrolysis of water to produce hydrogen.

BACKGROUND OF THE INVENTION

Currently the major process by which hydrogen is produced is by the steam reforming of methane. Another means of making hydrogen is by the electrolysis of water. The electricity required for electrolysis is mainly derived from the electric power grid, and the predominant source of grid electricity, combustion of fossil fuels, generates emissions, such as nitrogen oxides and particulate matter, as well as carbon dioxide. One way to eliminate such emissions is to use solar generated electricity to electrolyze water to make hydrogen. Presently, efforts are directed toward improving the efficiency, durability, and cost of the hydrogen production processes. Small PEC devices using specially coated research-grade amorphous silicon (a-Si) solar cells, together with a platinum electrode housed in a small quartz cell are disclosed in U.S. Ser. No. 10/662,853; filed Sep. 15, 2003 and U.S. Ser. No. 10/608,509; filed Jun. 27, 2003, incorporated herein by reference in their entirety as a general teaching tool.

However, systems consisting of solar cells to make electricity together with electrolyzers to dissociate water into hydrogen and oxygen are costly compared to producing hydrogen by the steam reforming of methane. These attempts have been made to produce hydrogen gas to supply vehicle-fueling stations by using electricity from photovoltaic panels and commercially available electrolyzers to split water. These projects have proved unsatisfactory and were usually short-lived due to the low efficiency and high cost of the combined technology, which only converted 2% to 6% of the solar energy to hydrogen fuel energy, thus greatly increasing the costs, the resulting hydrogen fuel cost (at least $11 per kilogram of hydrogen), and the large area covered by the system.

SUMMARY OF THE INVENTION

To overcome the disadvantages of the prior art, an apparatus for creating hydrogen from the disassociation of water using sunlight (photoelectrolysis) is provided. The system utilizes an aqueous fluid filled container which functions both to hold the water to be disassociated and as a light collecting lens. A photovoltaic module (collection of photovoltaic cells wired together) is positioned at a point to most efficiently accept the refracted light from the fluid filled container. A pair of electrodes which are coupled to the photovoltaic module are disposed within the fluid and configured to split the water into hydrogen and oxygen.

In one embodiment of the invention, the aforementioned apparatus has first and second chambers with a fluid passage therebetween. A photovoltaic module and an electrode are coupled to the fluid within the first chamber and a second counter-electrode is positioned within the second chamber. The first and second chambers define first and second gas collecting regions. A light focusing element is associated with the photovoltaic module.

In another embodiment of the present invention, an assembly for disassociation of water using sunlight is provided which is formed of a pliable polymer material. A chamber is formed of the pliable polymer material which is configured to define a fluid filled lens when filled with an aqueous electrolyte solution. A photovoltaic module is positioned relative to the focal point of the fluid filled lens to convert collected light from the fluid filled lens into DC current. The DC current from the photovoltaic module is then used to disassociate the electrolyte solution into hydrogen and oxygen.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses. In one aspect of the present invention, there is provided a photoelectrochemical (PEC) system, which is an integrated combination of photovoltaic (PV) cells (a photovoltaic module) with electrolysis chambers that uses solar energy to directly split water into hydrogen and oxygen. The current invention is a design for a self-contained solar hydrogen generator consisting of a PEC system based on simple, low-cost materials, i.e. a plastic-film or acrylic sheet chamber, commercially available crystalline silicon (c-Si) PV cells, Ni and coated Ni electrodes, and a basic electrolyte (water containing dissolved KOH). The unique design of the chamber: 1) leads to separation of the hydrogen and oxygen, 2) focuses the sunlight on the PV cells so that a smaller cell area creates more hydrogen (photoenhancement), and 3) allows for ease of manufacturing.

Figure 4:
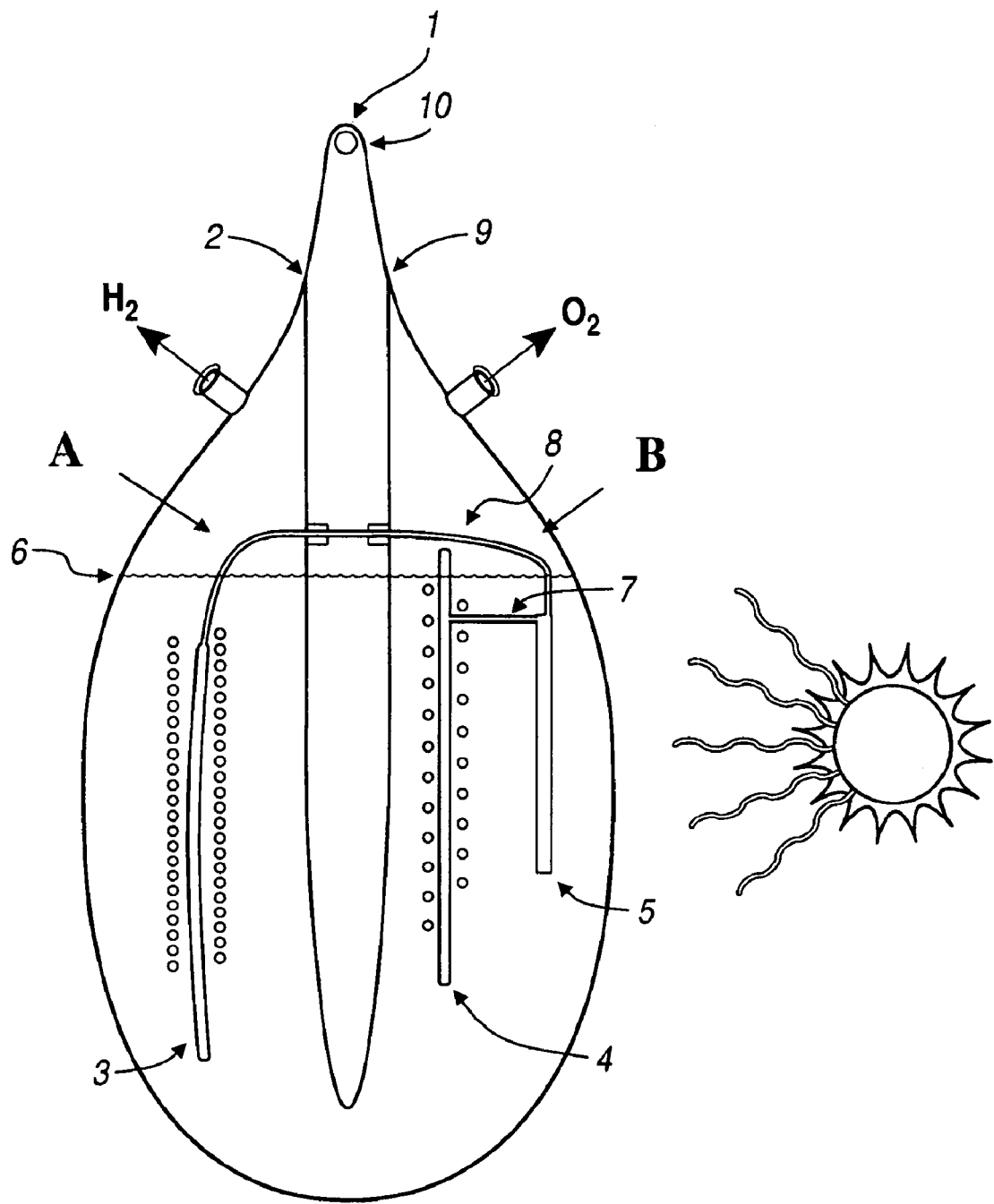
FIG. 4 represents the layout of the tube reactor shown in FIG. 2.

In this regard, the system in FIG. 4 utilizes an optically transparent container 1 configured to hold aqueous solutions being disassociated. The optically transparent container 1 is shaped to form a fluid filled lens which focuses collected light onto photovoltaic cells 5. These photovoltaic cells 5 convert the focused light into a direct current (DC) electricity that is used to disassociate the water within the solution in container 1.

The transparent container 1 can be configured to focus light to a position either inside or outside of the container 1. The photovoltaic cells 5 are positioned at a location that optimizes the amount of light falling on the photovoltaic cells 5. This location, which is chosen to maximize the output of the photovoltaic cells, may or may not represent the focal point or an approximate focal point of the fluid filled lens formed by the transparent container 1.

Although triple junction a-Si PV cells with an open circuit output voltage, Voc, of 1.8 to 2.4 volts can optionally be used for water splitting, more readily available c-Si PV cells connected in series to produce a Voc of 2.4 -3.6 volts (each cell produces approximately 0.6 volts) tend to split water more efficiently. Optionally it is envisioned that PV cells can be formed of amorphous silicon, crystalline silicon, cadmium telluride (CdTe), copper indium diselenide ($CuInSe_2$), or combinations thereof. In this regard, a series of cells formed of various materials can be electrically linked together.

This higher voltage is required to provide the minimum voltage to split water (1.23 volts), and overcome over-voltage effects due to: 1) the activation energy of the water splitting reactions, especially at the oxygen electrode; 2) mass transport effects; and, 3) the resistance in the electrical circuit, including the electrodes and electrolyte.

Previously, most experimental PEC devices have been very small, usually 1 $cm^2$ or less in area, and have produced a very small current which evolved hydrogen at a minute rate. The larger the surface area of the PV device, the greater the current produced and the greater the rate of hydrogen production. A scaled up PEC device (PEC system) made from c-Si photovoltaic cells with a total area of approximately 415 $cm^2$ with the solar cells appropriately wired together produces a higher flow of hydrogen for more practical uses.

An important feature of the design of this invention is a dual-chamber self-contained electrolysis cell 1 containing the c-Si PV cells 5, electrodes 3 and 4, and electrolyte solution (FIG. 4). The electrolysis cells 1 consist of layers of flexible plastic film forming two chambers or bladders A and B—a chamber around the cathode where hydrogen is generated A and a chamber around the anode where oxygen is generated B. Light enters the PEC device directly through one side of the electrolysis chamber. Appropriate films are light transmissive, translucent, and/or transparent. Appropriate films that transmit approximately 90% (or more) of the light and resist attack by corrosive electrolyte solutions include clear plastics such as PFA Teflon, FEP Teflon, Tefzel, polyester, polyethylene, and polypropylene.

Although the two chambers in FIG. 4 are separated at the top and sides, so that the hydrogen and oxygen gases that rise from the electrolyte solution (due to the gases' buoyancy) cannot become mixed, they are joined at their bottoms, to allow migration of ions. Furthermore, in this design, the Ni cathode 3 and coated Ni anode 4 are stable in the basic electrolyte and are electrically connected with a circuit isolated from the electrolyte, so that an electric current can flow between them to split water into its elements, hydrogen and oxygen. This design allows for easy assembly line production of a complete PEC system since the PV cells 5, electrodes 3 and 4, electrical connections, encapsulation coverings, and the plastic film electrolysis chambers can be assembled in a continuous sequence of operations.

The design in the current invention provides a PEC device that can be further scaled up by connecting multiple units together and used for practical purposes, including powering fuel cell vehicles or stationary fuel cells.

Figure 1:
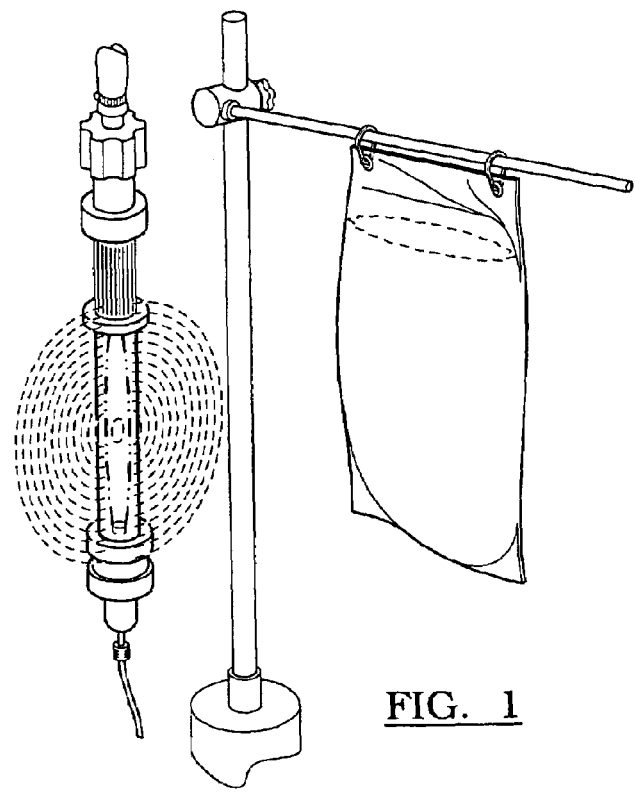
FIG. 1 is a bag reactor according to the teachings of the present invention.

FIG. 1 shows an a-Si based PEC system having an area of approximately 362 $cm^2$ mounted inside a single chamber bag reactor. The solar cells were obtained from Unipac-10 a-Si panels (Unisolar, Troy, Mich.) by cutting them apart and wiring six solar cells in parallel to increase the current. The a-Si solar cells were connected to a glass plate coated with conductive doped tin oxide (3 mm thick Tec 7 Pilkington glass). This combination served as the photoanode. The Tefzel coating on the solar cells protected them from corrosive attack by the basic electrolyte. The Tefzel coating is a fluoropolymer that is normally used to protect solar cells from the elements outdoors, such as rain and ozone. A Ni wire mesh cathode was mounted behind the photoanode. The photoanode was epoxied to the sides of the bag reactor in an attempt to prevent the $O_2$ generated on its surface from mixing with the $H_2$ generated on the Ni cathode. It was intended that the gases would rise to the top of the reactor and exit through fittings. However, the difficulty of sealing the PV module/electrode assembly to the sides of the bag led to leaks between the chambers. Also, the efficiency, which was approximately 4%, was reduced by the absorption of light (~20%) by the doped tin oxide, the low open circuit voltage (Voc), ~1.8 volts, and over voltage effects at the doped tin oxide due to its resistance (the electrical connection with the PV cells was made only around the outside edges), and the lack of very effective catalytic activity on doped tin oxide for $O_2$ production.

Subsequent to this initial effort, other reactors were constructed using a similar design. Three limitations that we identified were: 1) the Ni mesh tended to retain excessive bubbles, which clung to the electrode surface and contributed to an over voltage by preventing effective contact between the KOH solution and the electrode, 2) the doped tin oxide was making most of the gas at the edges, where metal epoxy connections were exposed to the electrolyte, and 3) the single-chamber bag design made electrode construction difficult and contributed to leaks that thwarted gas collection.

With general reference to FIG. 4, PEC reactors based on c-Si PV cells 5 obtained from a Connecticut Solar 10W Expedition solar panel (Connecticut Solar, Putnam, Conn.) are coupled to the fluid filled container. The panels came with 20 cells wired together to produce a module with sufficient voltage to charge a 12-volt battery, and coated with a clear Epoxy shield. Panels were cut apart into units with two cells internally wired together (approximately 1.2 volts Voc each), and three such units were wired together in series to produce a 3.6 volt Voc unit with an area of approximately 138 $cm^2$. On a sunny day such a unit produced 0.76 A in a small electrolyzer built using a Ni foil cathode and a Ni foil anode coated with $RuO_2$ using a sintering process at 350° C. Each electrode 3 and 4 in the electrolyzer had an area of approximately 128 $cm^2$. The hydrogen production efficiency was 7.1% based on the area of the solar cells and the intensity of the natural sunlight.

Three of the above PV units, with an area of approximately 415 $cm^2$, wired in parallel would produce at least 2.28 A in a PEC electrolysis cell with a larger anode and cathode, such as we would install in the 16"×16" PEC bag reactor described below.

Figure 2:
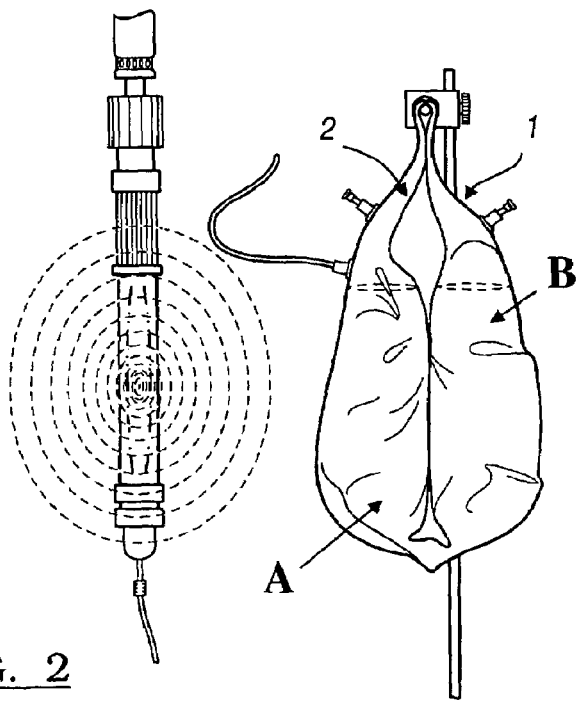
FIG. 2 is a bag reactor fabricated from polyester tube stock and four bulkhead fittings being irradiated using a xenon arc lamp.

Shown in FIG. 2 is a PEC system utilizing two divided-chambers 1 and 2, made of flexible plastic-film, i.e., a bag reactor with separate chambers A and B for the anode and cathode. This design had several advantages over prior art systems. These included: 1) ease of manufacture, 2) it allowed easy migration of the ions from one side to the other through an internal salt bridge at the bottom of the reactor, 3) it easily kept the gases, $H_2$ and $O_2$, separated from each other and allowed them to rise to the tops of the chambers where they were separated from the electrolyte, 4) it used more effective catalyzed metal foil electrodes with simple wire connections to the PV panels to increase the electrolysis efficiency, and 5) it used the curved surface of the reactor to focus the sunlight onto the PV panels and thereby increase their efficiency per unit area. This reactor used available polyester-film tube stock, and mounted the PV panels inside the reactor chamber and surrounded by the electrolyte solution. Since the solution takes the shape of its curved container, the reactor acted as a convex lens that focused the solar radiation onto the PV cells at an increased intensity. The increase was measured using a submersible light detection system that we built and calibrated against a known solar energy sensor. On a cloud-free sunny day in October, and with the reactor pointed at the sun, a measured 1.2-fold increase in the solar irradiance at a point approximately 2" to 3" from the curved wall inside a 16"×16" polyester bag.

In practical terms, what this means is that a 16"×16" bag PEC reactor that, when filled with liquid has a cross sectional area of 14"×14" (due to the curving of the flat surfaces when it is filled with liquid) can contain a smaller 9"×9" system of PV panels to generate up to 1.2 times more power for this given size of PV module.

Figure 3:
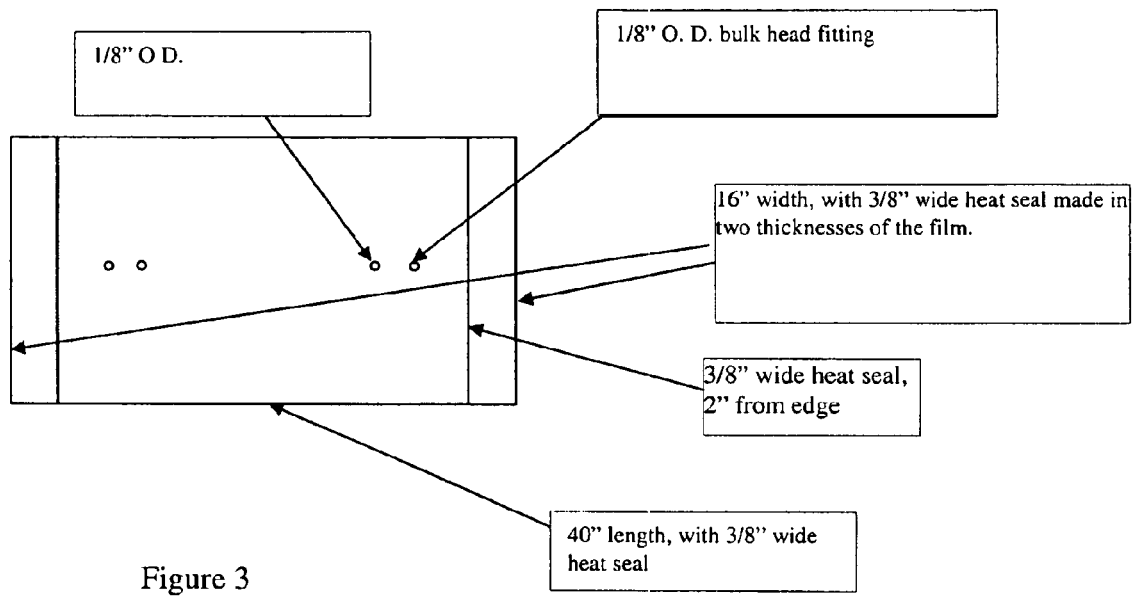
FIG. 3 is a layout for a bag reactor shown in FIG. 2.

As seen in FIG. 3, a transparent polyester film tube stock (Model number TRS-16125, Kapak Corporation, Minneapolis, Minn.) that was 16" wide and 4.5 mils thick was used to construct the bag reactor (www.kapak.com). A 40" length of the tube stock (which refers to a roll of two thicknesses of the film sealed at the edges) was cut. Then, using a cork borer, four holes were made to accept the bulkhead fittings. One-eighth inch outer diameter Teflon bulkhead fittings with Teflon washers on each side were inserted and tightened into each hole. The PV cells and electrodes were put into the bag and the wires were put through septa that were held in two of the bulkhead fittings (the fittings that were 6 inches from the edge of the film).

Heat seals were made using a heat sealer designed specifically for the film (Kapak Corporation, Model 118, 125 Watt pouch sealer. First, after insertion of the electrodes and PV cells, heat seals were made 2" in from each end of the bag. Second, on each end of the bag, one thickness of the film was removed up to the ⅜"-wide heat seals (approximately a 2"×16" piece of film). Third, the bag was folded over to form a 16"×20" system. Fourth, a ⅜"-wide heat seal along the overlapping 16"-wide film edges was made to form a loop that was used to suspend the reactor on a 2'-long, 0.5" O.D. aluminum rod supported at both ends. The trimming of the film to one thickness at the ends, prior to the final heat seal, was necessary because four thicknesses of the film could not be heat sealed together. The reactor was then filled with 5 M KOH to a level slightly below the two lower bulkhead fittings that contain the septa. As the divided chamber is formed of tube stock folded over to form two chambers, it is not necessary to heat seal the electrode to the sides of the bag to form separate compartments A and B. In other words, the PV panel and/or the electrodes are floating or held in the solution so it is not necessary for the PV panel to be the exact size of the bag; and the dual-chamber design eliminates the need to heat seal the bag to the edges of the PV panel. Thus, the 40 inch long and 16 inch wide tube-shaped material is folded and the ends sealed together to form a 20 inch long and 16 inch wide reactor. When this reactor is filled with electrolyte (approximately 12-15 liters volume) it attains the shape shown in FIG. 2.

The photoreactor of the invention has the following advantages: 1) a simple design using readily available materials, 2) under sunny cloud-free conditions an enhancement by a factor of 1.2 or more. As a practical illustration of the photoenhancement effect, consider the following example. Typically, c-Si solar cells are commercially available with PV efficiencies of at least 10%, and even up to 17% (Sharp Model NT185U1). Such cells are used to produce sufficient voltage (approximately 3.6 volts) to split water with an electrolysis efficiency of approximately 70% in the Ni/$RuO_2$—Ni electrolyzer system described earlier. Thus, the overall system efficiency with such a PV/electrolyzer combination would be 7% to 12%. Assembling such a PV system at a point inside a bag reactor where the sunlight is focused to produce a photoenhancement of 1.2, together with an electrode system, raises the overall hydrogen production rate by a factor of 1.2 for a given PV cell size.

The preferred embodiment of the PV system for the PEC system uses c-Si solar cells wired together to produce a module with an open-circuit voltage, $V_{oc}$, of approximately 3.6 volts. For several prototype reactors built, the c-Si cells were obtained from a Connecticut Solar 10 W Expedition solar panel (Connecticut Solar, Putnam, Conn.), as described above. Non-conducting epoxy was used to seal around the edges of the individual plastic-coated PV cells and over metallic connectors to build these prototypes. However, in the preferred embodiment, the cells would be manufactured as one integrated unit, wired together, and protected under a clear Epoxy covering. The positive wire from the PV panels would be connected to the anode, which is a $RuO_2$-coated piece of Ni foil that was approximately 12"×12" and immersed in 5 M KOH. The anode, where oxygen is produced, would be mounted behind the PV cells in the right-hand chamber. The negative wire 8 of the PV device would exit the right hand chamber through a gas-tight septum. It would then enter the left hand chamber through a gas-tight septum, and would be connected to the cathode 3 in the left-hand chamber described below. Also, it is possible to have the wire exit through the bulkhead fitting in a manner such that the insulation on the wire forms a gas-tight connection with ferrules on the bulkhead fitting.

The preferred cathode 3 design utilizes Ni foil mounted in the left-hand chamber to produce hydrogen. The Ni foil should be identical in size to that used in the anode side of the chamber (12"×12"). It has been found that this will overcome the bubble retention problem. Also, the electrode could be formed into an accordion pattern to obtain the same electrode area with a shorter length. Thus, the anode, cathode or both are formed in undulating, convoluted or saw-tooth configuration. In addition, the reactive surfaces of one or both electrodes are in such undulating, convoluted or saw-tooth configuration. The PV cell may also have such undulating, convoluted or saw-tooth configuration. A wire connected to the top of the electrode and insulated from the electrolyte, would pass through a gas tight septum in the left-hand chamber, and then connect to the anode as described above. The wire can also serve to support the electrode.

An internal salt bridge (an opening connecting the two chambers of the reactor) on the reactor bottom allows easy transport of the ions from one side to the other, but no transport of gas bubbles. The highly buoyant gases rise to the top of the chamber and were easily collected. The reactor did not provide a continuous flow, but rather released the gases in short bursts as the pressure on each side caused bulging in the chambers A and B, that then collapsed and released the gases. This limitation is of no significance for a reactor in which large amounts of the gases are collected, cleaned, and pressurized for storage. It was only an inconvenience in measuring the output of the reactor with sensitive flow meters. For that purpose, a rigid reactor (see FIGS. 5 and 6), such as a tank made of acrylic plastic sheets, proved to be more convenient.

Figure 5:
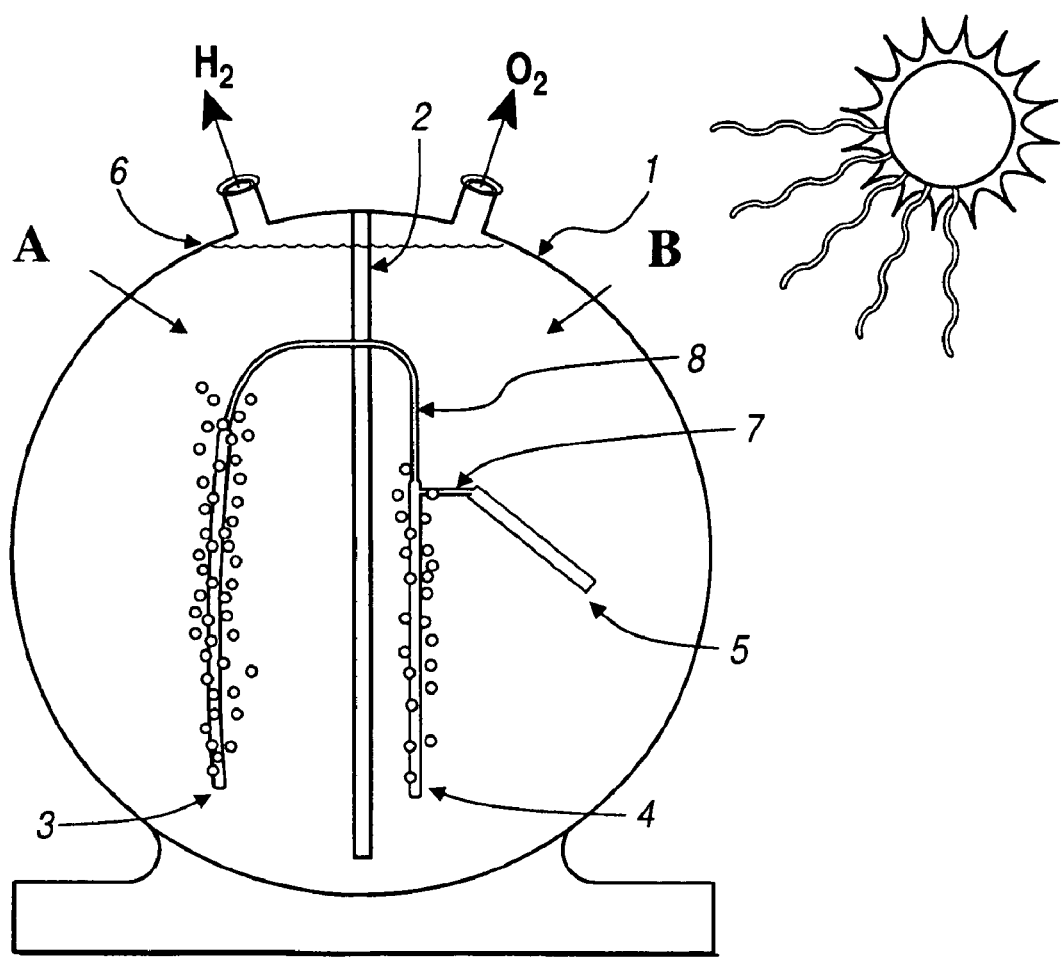
FIG. 5 and 6 are schematics of the divided chamber PEC reactor according to another embodiment of the invention.

A series of tests were conducted to determine the photo-enhancement of a curved chamber 1 (FIG. 2—bag reactor and FIG. 5—rigid spherical tank reactor). These tests found photoenhancements of between 1.2 and 8.6, using various configurations of panel size/shape and position relative to the various chambers. It is envisioned that pliable chambers, when filled with electrolyte and subjected to gravity, can be configured to have specific focal points and PV locations that maximize the photoenhancement of the system. For example, the solar energy was measured using a UDT c-Si blue-enhanced solar cell. The UDT c-Si solar cell was calibrated by comparing it to a U.S. Department of Energy (DOE) standard and a solar simulator operated to simulate AM 1.5 global output (this is approximately the irradiance at solar noon on a cloud-free day falling on a detector tilted at an angle of 37 degrees toward the sun). A practical calibration was obtained by measuring "one sun" on a cloud and haze-free day near the summer solstice. This practical one-sun calibration was in exact agreement with the value obtained in the inter-comparison with the DOE standard.

To measure the irradiance at points inside of a bag reactor, a small and submersible light-measuring device was made as follows. First, a small c-Si solar cell (OK-Solar, OK-2 cell, which is a miniature solar cell mounted on a 0.31"×0.23"×0.07" plastic carrier) was sealed to the open end of a piece of 3/8" I.D. plastic pipe using fast-drying epoxy. The two electrical wires from the solar cell were pulled through a small hole drilled into the pipe, and the hole was sealed. Finally, the opposite end of the pipe was sealed. This light sensor was used to measure the direct rays of the sun by pointing it at the sun on a cloud-free day. The sunlight was also measured using the UDT c-Si blue-enhanced solar cell. The submersible sensor vs. the c-Si blue-enhanced solar cell over a range of solar irradiances was validated. The submersible sensor was then used to measure the direct solar irradiance inside a 9.5"-wide polyester bag without water in the bag. Next, the bag was filled with water and the direct solar irradiance was measured from a point near the edge of the bag over to a point about 1.5 inches from the edge of the bag.

Measurements of the direct solar irradiance were made using the small submersible solar detector pointed at the sun under various conditions to determine the effect of the bag walls and filling the bag with water (Table 1). One thickness of the film reduced the solar energy measured by the c-Si solar cell by 11%. When the bag was filled with water and the detector was positioned near the outer edge of the bag, the reduction was only 3%. However, when the detector was moved back to a point approximately 1.5 inches from the curved edge of the water-filled bag, the solar energy measured by the detector increased by a factor of 2.4 above that for the measurement in the absence of a bag. The photoenhancement was very sensitive to movement inside the reactor, indicating that the light intensity was not uniform. A solar module responds best to an even irradiation across all parts of all of the cells. Therefore, the photoenhancement in a bag was measured using a larger solar detector consisting of a 4"×4" solar cell (Silicon Solar, model SS-PSC-103T) and a 16"×16" bag. At a point inside and approximately 2" to 3" from the outer curved wall of the bag chamber facing the sun, a photoenhancement of 1.2 was measured when the bag and PV cell were pointed directly at the sun on a cloud-free day in October in Warren, Mich.

TABLE 1

Measurements of photoenhancement in a bag reactor using a small submersible solar cell.

| Condition | Current measurement, mA | Ratio to bag-free measurement |
|---|---|---|
| Bag-free measurement | 0.71 | 1.00 |
| Detector inside bag, dry | 0.63 | 0.89 |
| Detector inside water-filled bag, next to bag wall | 0.69 | 0.97 |
| Detector inside water-filled bag, ~1.5" from bag wall | 1.71 | 2.41 |

TABLE 1-continued

Measurements of photoenhancement in a bag reactor using a small submersible solar cell.

The factor of 1.2 enhancement (photoenhancement) at a location approximately 2" to 3" from the outer wall and inside of the curved water-filled 16"×16" bag can provide a significant improvement in the hydrogen-production rate of a PEC device contained in a plastic film electrolysis chamber. For direct sunlight this could translate into a device with a factor of 1.2 improvement (or more if the optics were further optimized) in the hydrogen-production rate per unit area of the PV cells.

Also, it is possible to tilt the reactor so the PV cells face the sun. Further it is possible to focus light to the PV cell by any combination of light focusing elements, light collector elements, lenses, concentrators, guides and reflectors in the reactor, on the reactor or outside the reactor. This would only require two adjustments in the reactor construction: 1) an adjustment in the heights of the anode (lower) and cathode (higher) components, since the tilting lowers the electrolyte level in the anode compartment and raises it in the cathode compartment, and 2) placing the $H_2$ and $O_2$ fittings higher and lower in the two chambers, respectively.

However, it should be noted that the photoenhancement due to focusing of the sunlight would occur only for direct sunlight, i.e., that directly from the sun disk. Nonetheless, in the regions of the southwestern U.S., where large-scale photolytic hydrogen production from water splitting is most feasible, direct sunlight occurs during 75-80% of the daylight hours. On a cloud-free day, the direct component of solar radiation is typically 85% of the total (global) solar radiation.

To get an estimate of how much hydrogen each bag in the preferred embodiment described above would produce, consider the output of a solar module consisting three 138 $cm^2$ Connecticut Solar modules (from a Connecticut Solar 10W Expedition solar panel) wired in parallel with each module outputting 3.6 volts and 0.76 A in direct, cloud-free sunlight. Such a system would produce 2.28 A of current in the absence of any photoenhancement. When the PV modules are positioned properly in the above-described bag reactor, a photoenhancement of at least 1.2 would be expected to occur. Thus, the current would be expected to increase to 2.74 A. This translates into a production rate of 0.31 moles of hydrogen gas per day for a sunny day with a total daily solar energy input of 600 mW h/$cm^2$. Thus, the 16"×16" divided-chamber bag reactor described above would produce approximately 0.62 g of hydrogen per day on a cloud-free day. Approximately 1600 such bags would be needed to produce a kg (500 moles) of hydrogen per day.

Thus, to fuel an automobile equipped with a fuel-cell based propulsion system delivering 60 miles per kilogram of hydrogen (a conservative estimate), and traveling 30 miles per day, a system of 800 bags would be required. This system would require a holding device with dimensions of approximately 1800 $ft^2$, to hold the bags, tilt them toward the sun, and follow the sun as it moved across the sky. The number of reactors could be greatly reduced, by up to a factor of approximately seven, by using optimal positioning of the PV module and using reactors with greater curvature to obtain a photoenhancement of 8.6. Also, using the more efficient solar cells to make the module for the PEC system, such as the 17% efficient cells used in the Sharp Model NT185U1 module, would further reduce the size of the PEC-based vehicle fueling station.

It is also possible to obtain many of the advantages of the photoenhancement effect by building a system in which the bag reactors are tilted at a fixed angle toward the noon position of the sun to obtain most of the benefit of direct sunlight without following the sun as it moves across the sky. Furthermore, it is also possible to build bag reactors with more curvature to increase the photoenhancement factor. Finally, it is possible to build a more rigid curved reactor, out of a clear plastic, such as acrylic plastic (i.e., Plexiglas®), to make a more durable reactor. A reactor of the design described herein made of Plexiglas® is fabricated by heating the Plexiglas and forming a wall that is bowed outward.

Figure 6:
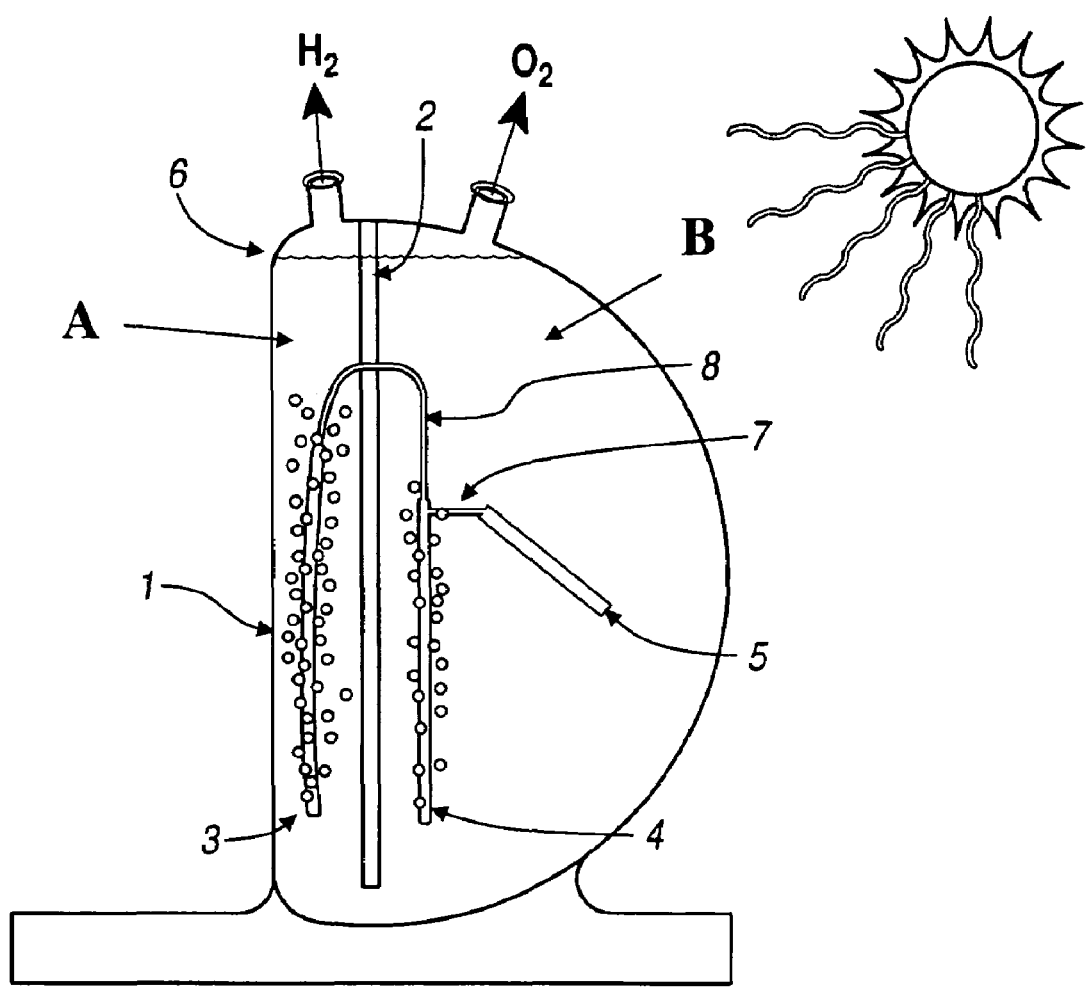

A seen in FIGS. 5 and 6, a rigid curved reactor 1 is formed by transparent Plexiglas®. FIG. 5 shows a spherical tank divided by a barrier 2 to form a pair of fluid filled cavities A and B. Disposed within the fluid filled cavities are the anode and cathode 3 and 4 coupled to the PV cells 5. As previously mentioned, the PV cells 5 are disposed at a location to maximize the amount of light collected by the PV cells 5. The optical characteristics of the reactor in FIG. 6 are identical to those in FIG. 5, but the reactor in FIG. 6 uses less electrolyte.

To determine the potential of a spherical tank to provide sunlight focusing, the following data was obtained. Table 2 shows the measurements of the direct solar irradiance (as Isc, the solar module short-circuit current) using a solar sensor with a 2.4"×2.7" active area and pointed at the sun when there were no clouds. The sensor was made from a Powerfilm MPT3.6-75A module that was epoxied to a 4"×4" rigid plastic backing. A spherical acrylic tank with a diameter of 15.7" was obtained from biOrb™ fish tanks and used to simulate a spherical fluid filled lens. The ratio of Isc when sunlight is focused on the module by the spherical tank to Isc when the solar module was pointed at the sun with no influence from the tank gives the photoenhancement for the given condition.

TABLE 2

Measurements of photoenhancement in a spherical reactor using a 2.4" × 2.7" solar module.

| Condition | Isc, mA | Ratio to Isc with no tank influence |
| --- | --- | --- |
| Point at the sun, no tank influence | 42.7 | 1.00 |
| Middle of tank, ~19 cm from front | 85.0 | 1.99 |
| Back of tank, ~38 cm from front | 159.0 | 3.72 |
| In air, 2.5 cm behind tank | 368.0 | 8.62 |

If the tank 1 was evenly divided into two chambers A and B to make a photoreactor, and if the PV module 5 was placed at the middle of the tank, a factor of (2) two photoenhancement was obtained. The photoenhancement increased as the 2.4"× 2.7" PV module 5 was moved further toward the back of the tank. Since the sun's direct rays fill the 2.4×2.7" module at the back of the tank to produce a factor of 3.7 photoenhancement, they would fill a larger module placed at the center of the tank.

The size and expected photoenhancement expected in the middle and at the far edge of a spherical 15.7" diameter tank was calculated. Considering half of the tank as a planar convex lens with a radius of curvature, R=7.8" and containing an aqueous electrolyte with an index of refraction, $\mu 2=1.33$, and $\mu 1$ for air=1.00 the calculated focal length, F, for light rays impinging on the front of the tank can be obtained from the equation:

$$F = \mu 2 \times R/(\mu 2 - \mu 1)$$

In the equation R is the radius of curvature of the "lens" (~7.8" for the spherical tank). Substituting in the above values for $\mu 1$, $\mu 2$, and R a focal length of approximately 31.5" is calculated. Based on this focal length, and ray tracing for parallel rays impinging on the tank, a PV module 5 with a diameter of approximately 11" and mounted at the middle of the 15.7" diameter tank filled with aqueous electrolyte would receive approximately a factor of two photoenhancement. If the PV module were put near the back of the tank 1 and the electrodes 3 and 4 were mounted out of the way of sunlight rays headed for the PV module 5, then a calculated photoenhancement of approximately 3.8 for an 8" diameter PV module would be expected.

Finally, it should be possible to make a reactor with even greater curvature in the vertical dimension, but this would have to be matched to a solar module that is wider than it is tall to maintain a uniform irradiation.

A Fresnel lens uses a series of concentric grooves molded into one side of a flat plastic sheet to form a planar convex lens. It uses the grooves rather than a curved surface to focus parallel light rays. A Fresnel lens (model NT46-572) from Edmund Optics (Barrington, N.J.) was tested on Jul. 1, 2004 during clear, cloud-free periods in Warren, Mich. The lens had dimensions of 32"×41" and a reported focal length of 39.4". A Connecticut Solar (Putnam, Conn.) solar module, type CellSico, with active solar cell dimensions of 125 mm×227 mm was used to measure the solar irradiance with and without the Fresnel lens present. A maximum photoenhancement of 7.0 was measured approximately 24" behind the lens. At greater distances the solar beam became more intensely focused on areas of the PV module, but these "hot spots" were much less efficient in producing current than a more uniform irradiation of the whole module. At lesser distances, the beam was uniform but was less intensely focused, which produced lower current. The Fresnel lens could increase the photoenhancement in the bag reactor, or even in the spherical tank reactor. It is envisioned that a Fresnel lens can be incorporated into the surface of a pliable polymer container 1 or the spherical tank 1 to increase photoenhancement of the systems.

In summary, hydrogen can be produced from clean renewable solar energy by splitting water using a photovoltaic system optimized for the electrolysis process. Hydrogen and fuel cells are preferred for future vehicles. This invention is a step closer to a practical hydrogen generation system. The cost estimate for renewable solar hydrogen generation from a PEC device is projected to be nearly as low as gasoline for the same mileage. PEC hydrogen could cost as little as $2 per gallon of gasoline equivalent, compared to $11 per gallon of gasoline equivalent for solar-generated hydrogen from currently available photovoltaic and electrolyzer technology.

This system can exceed the 2004 DOE-NREL hydrogen program goal for efficiency (7.5%), and is targeted to exceed the goals for long lifetime. The use here of relatively inexpensive materials (polyester bag or acrylic tank, Ni and coated Ni electrodes, and the least expensive solar cells available), together with the increase in the hydrogen-production rate attained by the bag or tank focusing effect will help in reducing the system cost. Also, the scale up in the size of this device should be linear, since it would merely involve connecting the hydrogen gas output of many small reactors to a common storage port.

Current photovoltaic cells connected to electrolyzers could also be used to split water, but the cost of the hydrogen (at least $11 per gallon of gasoline equivalent) would be much higher than hydrogen from our PEC reactor system in which the electrolyzer is integrated into the photovoltaic system in a manner such that the solar energy is focused by the container. Another alternative is to make photoanodes in continuous sheets of amorphous silicon. However, such photoanodes must be coated with a robust material such as modified tin oxide. Currently, these materials do not appear to have sufficient resistance to corrosion for a long-term marketable device, although the doped tin oxide is approaching that goal.

Commercial PV systems target efficiencies of about 10% for conditions referred to as AM1.5 global (this is approximately noon time sun on a cloud-free day in the summer in the northern U.S.). Such conditions can provide the equivalent of approximately 6-8 hours of irradiance at levels of 100 mW/cm$^2$. For such conditions, where direct sunshine can be used, the system provides a large increase in the hydrogen-production rate of 1.2 to 8.6 times or more. This system would only provide this gain for direct sunshine—scattered sunshine would not be focused. However, it is envisioned that solar hydrogen farms would be built in the desert regions of the southwestern U.S. where direct sunshine is available 75-80% of the time. The present system would work, albeit at a reduced efficiency, on cloudy days. The protective surfaces that are currently used on commercially available solar cells (fluoropolymers, glass and plastics resistant to attack by ozone and other atmospheric pollutants) also resist attack by 5 M KOH used in our electrolysis system.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An assembly comprising:
    a first chamber and a second chamber;
    a passage between said first and second chambers;
    a photovoltaic (PV) module and an electrode in said first chamber;
    a counter-electrode in said second chamber;
    said first chamber having a first gas collection region and said second chamber having a second gas collection region;
    an electrolyte in said first and second chambers and in said passage between said chambers; and
    a light focusing element associated with said PV module.
2. The assembly of claim 1 wherein said light focusing element comprises at least a portion of said first chamber being convex relative to a light source.
3. The assembly of claim 2, wherein said convex portion is flexed outward by electrolyte retained in said chamber.
4. The assembly of claim 2, wherein said convex portion is positioned related to the PV module to direct light thereon.
5. The assembly of claim 1 wherein said focusing element comprises a lens at an exterior surface of said first chamber.
6. The assembly of claim 1, wherein said PV module is movable relative to said convex portion to enhance incidence of light thereon.
7. The assembly of claim 1, wherein said first and second chambers and passage therebetween are defined by a single flexible envelope having distal ends folded toward one another to define said respective chambers adjacent respective said distal ends.
8. The assembly of claim 7, wherein the folded envelope is U-shaped, with respective legs of said U forming respective first and second chambers, and the base of said U forming said passage.
9. The assembly of claim 8, wherein gasses collect in said gas collection region in an upper portion of said legs.
10. The assembly of claim 8, wherein said ends of said legs are sealed.
11. The assembly of claim 8, wherein said legs are sealed to one another.
12. The assembly of claim 11, wherein said legs sealed to one another form a container having an annulus between said legs.
13. The assembly of claim 12, wherein the container has a strength of the seal and a strength container material sufficient to support the weight of the container, electrodes, PV module, and electrolyte when said container is supported from the annulus.
14. The assembly of claim 13, wherein said container is supported from the annulus adjacent the sealed legs.
15. The assembly of claim 13, wherein said first chamber is convex outward when said package is supported.
16. The assembly of claim 13, wherein said container is O-shaped and rotatable about a support for enhanced incidence of light on said PV module.
17. The assembly of claim 1 comprising a fluid access port in the first chamber for removal of gas and a fluid access port in the second chamber for removal of gas.
18. The assembly of claim 11 wherein said container has a shape selected from an oval, teardrop, O-shape and the like.
19. The assembly of claim 8, wherein said legs are sealed by a heat seal.
20. The assembly of claim 7, wherein said envelope is light transmissive, resists degradation by electrolyte, prevents or at least inhibits diffusion of gaseous hydrogen, oxygen or both, and is heat sealable to itself.
21. The assembly of claim 7, wherein said envelope comprises a polymeric material.
22. The assembly of claim 17, wherein respective fluid access ports provide vias for an electrically conductive path between the electrodes.
23. The assembly of claim 1, comprising an electrically conductive path, from the first electrode through an insulated access port in said first chamber, to an insulated access port in said second chamber, and to the counter-electrode.
24. The assembly of claim 23, wherein said electrically conductive path comprises a wire that joins said electrodes.
25. The assembly of claim 1, wherein said counter electrode comprises nickel.
26. The assembly of claim 1, wherein said electrode comprises ruthenium oxide coated on nickel or nickel alloy.
27. The assembly of claim 1, wherein said PV module comprises cells formed of a material selected from the group of crystalline silicon, amorphous silicon, triple junction material, and combinations thereof.
28. The assembly of claim 1, wherein said electrolyte comprises KOH.
29. The assembly of claim 1, wherein said electrolyte comprises 5 molar KOH.
30. The assembly of claim 1 wherein at least one of said electrode and counter-electrode has an undulating configuration.
31. A method to make an assembly for electrolysis of water comprising:
    a) providing a transparent cylindrical-shaped envelope having at least one access port;

b) placing a PV module and an electrode in the envelope adjacent one end of the envelope and placing a counter-electrode in the envelope adjacent the other end of the envelope;
c) sealing the two ends of the envelope and joining the ends together; and
d) inserting electrolyte in the sealed envelope through said access port.

32. The method of claim 31 wherein step a) comprises providing a sheet of transparent material and sealing opposite edges of said sheet together to form said cylindrical-shaped envelope.

33. The method of claim 31 wherein step c) comprises cutting a portion of each of said two ends, inward from an edge, thereby providing an uncut flap at each said end; and sealing said respective flaps together.

34. An apparatus for creating hydrogen from the disassociation of an aqueous electrolyte solution using sunlight comprising:

a fluid filled container which functions both to hold an aqueous electrolyte solution to be disassociated and as a light collecting lens;

a photovoltaic module positioned at a point to most efficiently accept the refracted light from the fluid filled container; and a pair of electrodes, coupled to the photovoltaic module disposed within the electrolyte solution and configured to split water within the electrolyte solution into hydrogen and oxygen.

35. The apparatus according to claim 34 wherein the fluid filled container defines a focal point when the container is subjected to gravity.

36. The apparatus according to claim 34 wherein the fluid filled container defines a convex outer surface.

* * * * *